(12) United States Patent
Chiang et al.

(10) Patent No.: US 6,921,727 B2
(45) Date of Patent: Jul. 26, 2005

(54) METHOD FOR MODIFYING DIELECTRIC CHARACTERISTICS OF DIELECTRIC LAYERS

(75) Inventors: Kang-Lie Chiang, San Jose, CA (US); Mahmoud Dahimene, Sunnyvale, CA (US); Xiaoye Zhao, Mountain View, CA (US); Yan Ye, Saratoga, CA (US); Gerardo A. Delgadino, Santa Clara, CA (US); Hoiman Hung, Cupertino, CA (US); Li-Qun Xia, Santa Clara, CA (US); Giuseppina R. Conti, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 118 days.

(21) Appl. No.: 10/387,160

(22) Filed: Mar. 11, 2003

(65) Prior Publication Data

US 2004/0180556 A1 Sep. 16, 2004

(51) Int. Cl.7 .................... H01L 21/31; H01L 21/469
(52) U.S. Cl. ........................... 438/778; 438/781
(58) Field of Search .................. 438/781, 778, 438/756, 723

(56) References Cited

U.S. PATENT DOCUMENTS

| | | | |
|---|---|---|---|
| 6,133,137 A | 10/2000 | Usami | 438/622 |
| 6,156,671 A * | 12/2000 | Chang et al. | 438/778 |
| 6,284,677 B1 * | 9/2001 | Hsiao et al. | 438/783 |
| 6,346,490 B1 | 2/2002 | Catabay et al. | 438/795 |
| 6,423,652 B1 * | 7/2002 | Chang et al. | 438/782 |
| 6,436,808 B1 * | 8/2002 | Ngo et al. | 438/623 |
| 6,465,372 B1 * | 10/2002 | Xia et al. | 438/787 |
| 6,528,410 B1 * | 3/2003 | Usami et al. | 438/624 |
| 6,528,432 B1 * | 3/2003 | Ngo et al. | 438/780 |
| 6,554,002 B2 * | 4/2003 | Wu et al. | 134/1.2 |
| 6,562,700 B1 * | 5/2003 | Gu et al. | 438/477 |
| 6,713,382 B1 * | 3/2004 | Pangrle et al. | 438/622 |
| 2002/0090784 A1 * | 7/2002 | Yoon | 438/257 |
| 2002/0113037 A1 * | 8/2002 | Wu et al. | 216/67 |
| 2003/0045098 A1 * | 3/2003 | Verhaverbeke et al. | 438/689 |
| 2003/0194495 A1 * | 10/2003 | Li et al. | 427/255.28 |
| 2003/0218427 A1 * | 11/2003 | Hoffman et al. | 315/111.41 |
| 2004/0058523 A1 * | 3/2004 | Li et al. | 438/622 |

FOREIGN PATENT DOCUMENTS

| | | | | |
|---|---|---|---|---|
| GB | 2 329 069 A | 10/1999 | | H01L/21/768 |
| WO | WO 02/01621 A2 | 3/2002 | | H01L/21/316 |

* cited by examiner

*Primary Examiner*—Matthew Smith
*Assistant Examiner*—Lex H. Malsawma
(74) *Attorney, Agent, or Firm*—Moser, Patterson & Sheridan LLP; Joseph Bach (57) ABSTRACT

A method of treating a dielectric layer having a low dielectric constant, where the dielectric layer has been processed in a manner that causes a change in the dielectric constant of an affected region of the layer. The treatment of the affected region may comprise etching, sputtering, annealing, or combinations thereof. The treatment returns the dielectric constant of the dielectric layer to substantially the dielectric constant that existed before processing.

35 Claims, 3 Drawing Sheets

METHOD FOR MODIFYING DIELECTRIC CHARACTERISTICS OF DIELECTRIC LAYERS

BACKGROUND OF THE INVENTION

1. Field of the Invention

The present invention generally relates to dielectric materials and, more particularly, to a method of treating a dielectric layer in order to modify the dielectric characteristics of the dielectric layer.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g., sub-micron dimensions), the materials used to fabricate such components contribute to their electrical performance. For example, low resistivity metal interconnects (e.g., copper and aluminum) provide conductive paths between the components on integrated circuits.

Copper is particularly advantageous for use in interconnect structures due to its desirable electrical properties. Copper interconnect systems are typically fabricated using a damascene process in which trenches and vias are etched into dielectric layers. The trenches and vias are filled with copper which is then planarized using, for example, a chemical-mechanical planarization (CMP) process.

Copper interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g., dielectric constants less than about 4.0) are needed.

Unfortunately, it is difficult to integrate low K dielectric materials into typical interconnect process schemes. For example, in conventional interconnect processing, a photoresist is used to pattern the low K dielectric material. Photoresist residue is stripped using, for example, an oxygen-based plasma. Unfortunately, exposure to oxygen-based plasmas have been found to cause deleterious effects in many low K dielectric materials. The low K dielectric material may be susceptible to "K loss," in which the dielectric constant of the low K dielectric increases undesirably due to exposure to the oxygen-based plasma used in the photoresist stripping procedure. As a result, cross-talk and RC delay become more problematic after the photoresist stripping procedure.

Therefore, a need exists in the art for a method of treating a dielectric layer that has incurred K loss such that the decrease in dielectric constant may be partially or completely corrected.

SUMMARY OF THE INVENTION

The present invention generally relates to a method of processing a substrate having a low dielectric constant dielectric layer such that the processing alters the dielectric constant in an affected region and treating the affected region of the dielectric layer. The dielectric constant in the affected region is "relieved" (i.e., partially or completely repaired, removed or corrected) and the low dielectric constant of the material is restored by treating the affected region. This treatment may comprise etching the region, sputtering the region, annealing the region, or combinations thereof.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The present invention relates to treating a dielectric layer having a low dielectric constant such that a dielectric characteristic of the layer is modified. The treatment may be used to lower the dielectric constant of the dielectric layer in order to recover or relieve a loss in dielectric constant that was caused by a previous process step. The previous increase in dielectric constant may have been due to exposing the dielectric layer to an oxygen-containing environment, such as an oxygen-based plasma.

Figure 1:
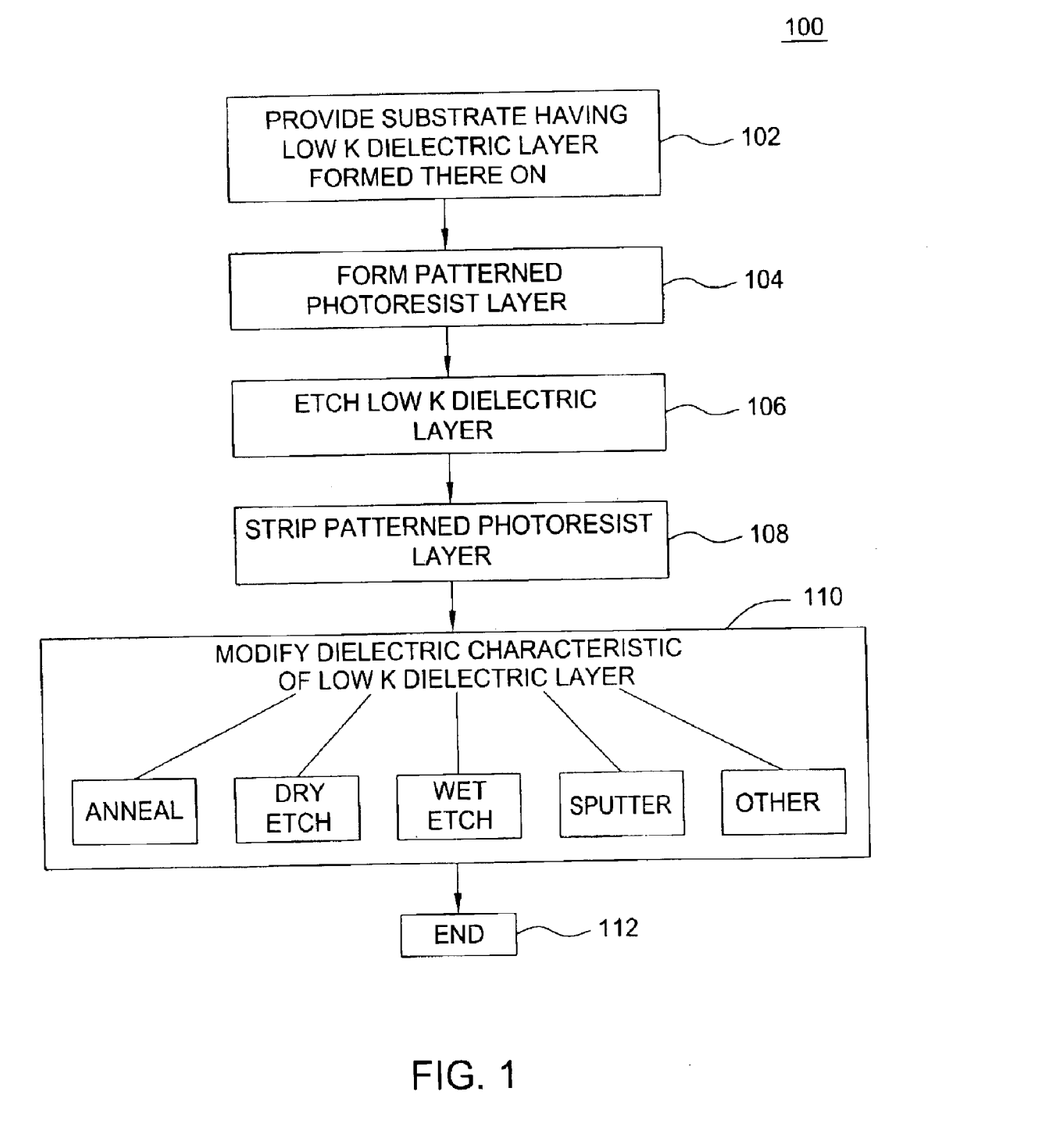
FIG. 1 depicts a flow diagram of a method that may be used to practice embodiments of the invention.

FIG. 1 depicts a flow diagram of a method that summarizes a process 100 of etching a dielectric layer and relieving a loss in dielectric constant according to one embodiment of the present invention. FIGS. 2A–2D are cross-sectional views of a substrate 200 during different stages of the process 100. At step 102, a substrate having a low K dielectric layer formed thereon is provided to an etch chamber. At step 104, a patterned photoresist layer is formed atop the low K dielectric layer. The low K dielectric layer is then etched, at step 106. Following the etching of the low K dielectric layer at step 108, the patterned photoresist layer is stripped. Such processing (e.g., etching and stripping) may increase the dielectric constant of certain regions of the low K dielectric layer. In step 110, the low K dielectric layer is treated to modify a dielectric characteristic of the layer. The process for modifying the dielectric constant of the layer is referred to as relieving the dielectric constant of an affected region, wherein the relieving process may be accomplished by removing a portion of the dielectric layer or altering the dielectric characteristics of an affected region of the layer. As such, once a region is relieved, the overall dielectric constant of the layer returns to substantially the same dielectric constant that the layer had before processing, e.g., etching and stripping. As discussed in detail with respect to FIG. 2A–2D, the dielectric characteristic may be modified using any of a number of techniques including etching an affected region of the low K dielectric layer, sputtering an affected region of the layer, annealing an affected region, or combinations thereof. The method ends with step 112.

Figure 2A:
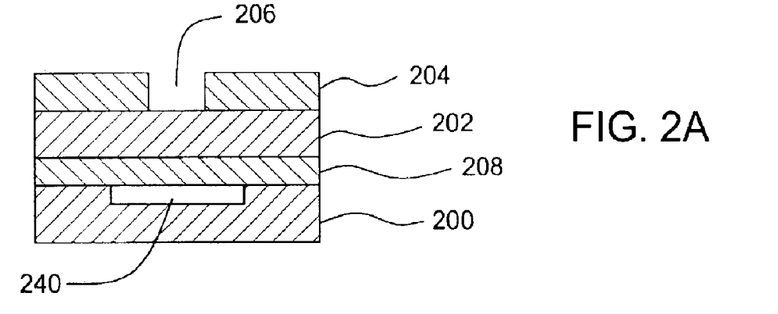
FIGS. 2A–2D are cross-sectional views of a substrate during different stages of a dielectric layer processing sequence consistent with one example of an inventive treatment.

The substrate 200 may include a feature 240, such as a conductive feature or a semiconductor device. As shown in FIG. 2A, the dielectric layer 202 is deposited on the substrate 200. The dielectric layer 202 comprises a low K dielectric material such as, for example, an organosilicate material, a porous oxide material, a silsesquioxane material, paralyne, a spin-on glass material such as un-doped silicon glass (USG), a fluorine-doped silicon glass (FSG) or combinations thereof. The dielectric layer 202 may have a dielectric constant less than about 4.0. One example of a suitable organosilicate-based low K dielectric layer is commercially available from Applied Materials, Inc., of Santa Clara, Calif. and sold under the trade names Black Diamond™ and Black Diamond™ II. In these organosilicate materials, the amount of carbon in the material is generally 10% or more. Additionally, these materials have a porosity of 10% or more.

In one embodiment of the invention, the dielectric layer 202 comprises silicon, oxygen, and carbon. The dielectric layer 202 may have a carbon content between about 5 and about 30 atomic percent (excluding hydrogen atoms), illustratively between about 5 and about 20 atomic percent, and may be deposited by providing a cyclic organosilicon compound, an aliphatic compound and an oxidizing gas to a deposition chamber under conditions sufficient to form an ultra low dielectric constant film (k less than 2.5). These ultra low dielectric constant films generally have a carbon content of greater than or equal to ten percent.

The cyclic organosilicon compound may include a ring structure having three or more silicon atoms and the ring structure may further comprise one or more oxygen atoms. The aliphatic compound may include linear or branched (i.e. acyclic) organosilicon compounds having one or more silicon atoms and one or more carbon atoms and linear or branched hydrocarbon compounds having at least one unsaturated carbon bond. The oxidizing gas may comprise oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof. The dielectric layer 202 may be deposited to a thickness of about 5,000 Angstroms (Å). The dielectric layer 202 may be formed using a process such as a plasma enhanced chemical vapor deposition process. Suitable methods for depositing the dielectric layer 202 are described in co-pending U.S. patent application entitled, "Crosslink Cyclo-Siloxane Compound With Linear Bridging Group To Form Ultra Low K Dielectric," Ser. No. 10/121,284, filed Apr. 11, 2002, which is herein incorporated by reference in its entirety.

The dielectric layer 202 may be deposited over an optional etch stop layer 208. The optional etch stop layer 208 has etch characteristics that are different than the dielectric layer 202. The optional etch stop layer 208 may comprise, for example, a low K dielectric material, such as a silicon carbide-based material.

A patterned photoresist layer 204 is formed on the dielectric layer 202. The patterned photoresist layer 204 may comprise a conventional carbon-based, organic or polymeric material used to pattern integrated circuits.

Figure 2B:
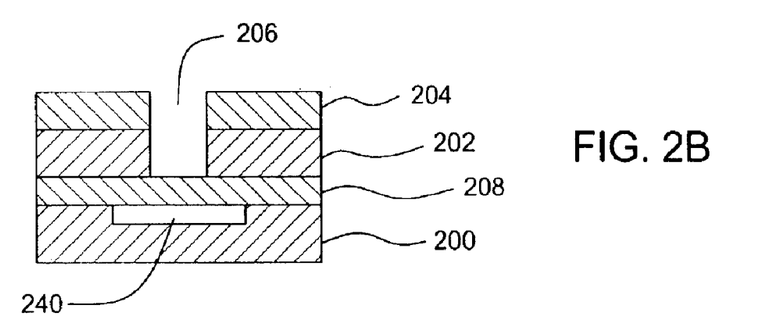

The patterned photoresist layer 204 is conventionally patterned by, for example, applying a photoresist to the dielectric layer 202 and exposing selected regions of photoresist to ultraviolet radiation. Selected regions of the photoresist layer 204 may then be removed to define a feature 206 such as a via or trench. As shown in FIG. 2B, the dielectric layer 202 is then etched to extend the feature into the dielectric layer 202. The dielectric layer 202 may be etched using an etchant (e.g. a plasma comprising fluorine and oxygen) that is suitable for etching the dielectric layer 202 and stopping on, for example, the optional etch stop layer 208.

In one embodiment of the invention, the dielectric layer 202 is etched using a plasma comprising fluorine, carbon, and oxygen ions. The dielectric layer 202 may be etched in a chamber such as the chamber 310 of FIG. 3 described in greater detail below. In one illustrative embodiment of the invention where the dielectric layer 202 is an organic doped silicon glass such as Black Diamond™ or Black Diamond™ II, etching may be performed in the etch reactor of FIG. 3 by supplying at least about 2000 sccm of Ar, about 4 to 400 sccm of $CF_4$, 2 to 200 sccm of $CH_2F_2$, and 4 to 400 sccm of $N_2$, applying to a solenoid about 0 to 5 volts, DC, applying a source power of about 100 to 300 Watts, applying a bias power of about 1500 to 2500 Watts, maintaining a wafer temperature at about 0 to 30 degrees Celsius and a pressure in the processing chamber of about 60 to 150 mTorr or higher. One specific process recipe provides 40 sccm of $CF_4$, 20 sccm of $CH_2F_2$, 40 sccm of $N_2$ and 2000 sccm of Ar, applies 2 Volts (DC) to one solenoid, 200 Watts to an upper electrode 328, and 2000 Watts to a pedestal, and maintains a wafer temperature at about 20 degrees Celsius and a pressure in the reactor at 100 mTorr.

Figure 2C:
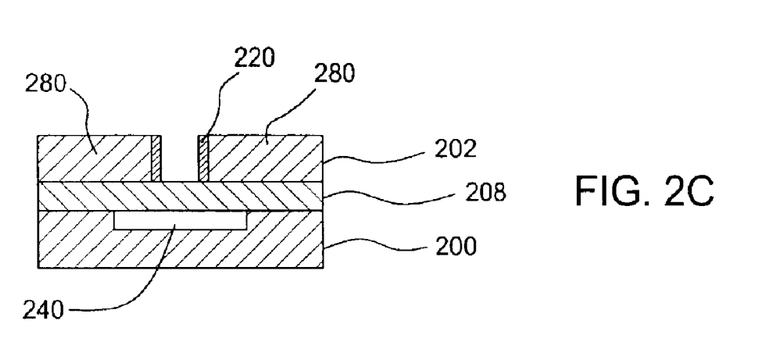
Figure 2D:
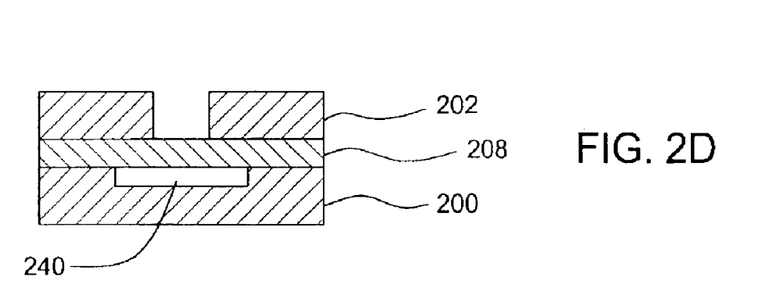

As shown in FIG. 2C, the photoresist layer 204 is removed (i.e., stripped) by exposing the photoresist layer 204 to, for example, an oxygen-based plasma. The stripping may comprise flowing an oxygen-based gas such as oxygen or ozone and a gas such as nitrogen into a chamber such as an Advanced Strip and Passivation Chamber (ASP), commercially available from Applied Materials Inc, of Santa Clara, Calif. A source power of about 2 kW may be applied to an antenna within the chamber to ignite the oxygen-based gas into a plasma. The chamber may be maintained at a pressure of about 100 mTorr and at a temperature between about 20° C. to about 400° C.

After stripping, the photoresist layer 204 may be optionally cleaned using, for example, a wet cleaning module. A suitable wet cleaning module is described in detail in U.S. patent application Ser. No. 09/945,454, filed Aug. 31, 2001, which is herein incorporated by reference. The wet module applies cleaning chemicals and/or rinsing agents in order to remove residue that may remain on the substrate 200 after stripping. The cleaning chemicals may include, for example, ACT-NE14, commercially available from Ashland Specialty Chemical Company's Electronic Chemicals Division or other suitable cleaning solutions.

As shown in FIG. 2C, the photoresist layer 204 is removed by the stripping process and the optional wet cleaning process. However, a region 220 of the dielectric layer 202 has the dielectric constant of the layer altered by the stripping process. The affected region 220 (such as a surface region depicted in FIG. 2C) may result from, for example, one or more mechanisms, such as the formation of hydroxyl (O—H) or silanol (Si—O—H) groups within the affected region 220. The affected region 220 may be characterized as having a higher concentration of hydrogen, a higher concentration of oxygen, a lower concentration of carbon or combinations thereof with respect to a bulk region 280 of the dielectric layer 202 that was not affected by the stripping of the photoresist layer 204. The affected region 220 may have a thickness in a range of about 50 Å to about 600 Å depending on the quality of the ashing process.

The affected region 220 of the dielectric layer 202 is treated to partially or completely repair the damage caused by the stripping of the photoresist layer 204. The treatment (e.g., surface modification) may change the chemical composition of the affected region 220. The treatment may effect a decrease in an oxygen concentration within the affected surface layer, a decrease in a hydrogen concentration within the affected surface layer, or combinations thereof. The treatment may result in partial or complete removal of the affected region 220.

In one embodiment of the invention, the affected region 220 of the dielectric layer 202 is annealed. The annealing may comprise placing the substrate 200 having the dielectric layer 202 thereon, into a process chamber that is capable of heating the affected region 220 of the dielectric layer 202. The process chamber may be, for example, a deposition chamber used for the deposition of dielectric layers, a chamber used for stripping photoresist layers, an etch chamber, among other process chambers. Alternatively, annealing of the affected region 220 may be performed in a rapid thermal process (RTP) chamber.

The annealing of the dielectric layer 202 is performed in an atmosphere consisting essentially of one or more inert gases. The one or more inert gases may comprise, for example, nitrogen, helium, argon, among other inert gases. The dielectric layer 202 may be heated to a temperature in a range from about 100° C. to about 600° C. for a length of time that depends upon the extent of damage. For example, to moderately alter the dielectric constant, the substrate may be annealed at 350° C. for 30 minutes in a He atmosphere having a pressure of 7 torr. The annealing partially or completely repairs the affected region of the dielectric layer 202. The dielectric constant may be partially or completely repaired, for example, by converting hydroxyl (—OH) or silanol (Si—O—H) moieties to siloxane (Si—O—Si) moieties within the damaged region 320.

The affected region 220 of the dielectric layer 202 may be annealed by placing the substrate 200 on a pedestal such as the pedestal in a process chamber and heating the pedestal to a temperature between about 100° C. to about 400° C. as described above. Alternatively, the affected region 220 of the dielectric layer 202 may be heated using other techniques such as exposing the affected region 220 to a radiative heat source such as an infrared lamp, a laser, and the like.

In one exemplary embodiment of the invention, a dielectric layer comprising silicon, oxygen, and carbon (and having an initial dielectric constant of about 3), having a photoresist similar to the photoresist layer 204 formed thereon, was placed in a process chamber. The photoresist layer 204 was stripped using an oxygen-based plasma. The dielectric constant of the dielectric layer after stripping was about 3.27 (about 9% higher than the original K value). The dielectric layer was annealed at about 350° C. in a Helium atmosphere for about 30 minutes under 7 torr pressure. The dielectric constant after annealing was about 3.05 (about 2% higher than the original K value).

In another embodiment of the invention, the dielectric constant of the affected region 220 is relieved by physically bombarding (e.g., sputtering) the affected region. The affected region 220 may be bombarded with energized atoms or ions and the like. For example, the substrate 200 having the dielectric layer 202 formed thereon may be provided to a processing chamber such as the etch chamber of FIG. 3. A sputtering gas such as, for example, argon, neon or other non-reactive gases capable of sputtering material from the dielectric layer 202 is admitted to the chamber. The sputtering gas may be ignited into a plasma by supplying a source power from the source to the upper electrode. A bias power may be applied using the source to the pedestal in order to facilitate directing ionized sputtering gas towards the substrate 200. The sputtering gas impacts the affected region 220, thereby physically ejecting (i.e., sputtering) at least portions of the affected region 220 from the dielectric layer 202.

The sputtering gas may be admitted to the chamber and may be maintained at a pressure in a range of about 5 mTorr to about 200 mtorr. The temperature of the pedestal may be maintained at about 10° C. or in a range of about −20° C. to about 40° C. A power of about 200 W to about 1000 W may be applied to the source and a bias power in a range of about 100 W to about 3000 W may be applied to the pedestal to facilitate sputtering of the affected region 220. The sputtering may take place for a period of time that depends on the extent of the altered dielectric constant.

In one exemplary embodiment of the invention, the affected layer 220 of dielectric layer 202 is sputtered in an argon plasma wherein argon is admitted to the chamber 110 at a flow rate of 700 sccm, the pedestal is maintained at a temperature of about 10° C., a power of about 500 W is applied to the source, a bias power of about 3000 W is applied to the pedestal 116 and the affected region 220 is sputtered for about 30 seconds. In one example, the K value of the affected region of the film before treatment was 3.26 and after treatment the K value was 3.1. The bulk film in this example had a K value of 3.0.

In another embodiment of the invention, the affected region 220 is treated by contacting the affected region 220 with a chemical etchant that is capable of partially or completely removing the affected region 220 of the dielectric layer 202. The chemical etchant may comprise one or more etchant gases that may be ignited into a plasma to facilitate the partial or complete removal of the affected region 220.

Figure 3:
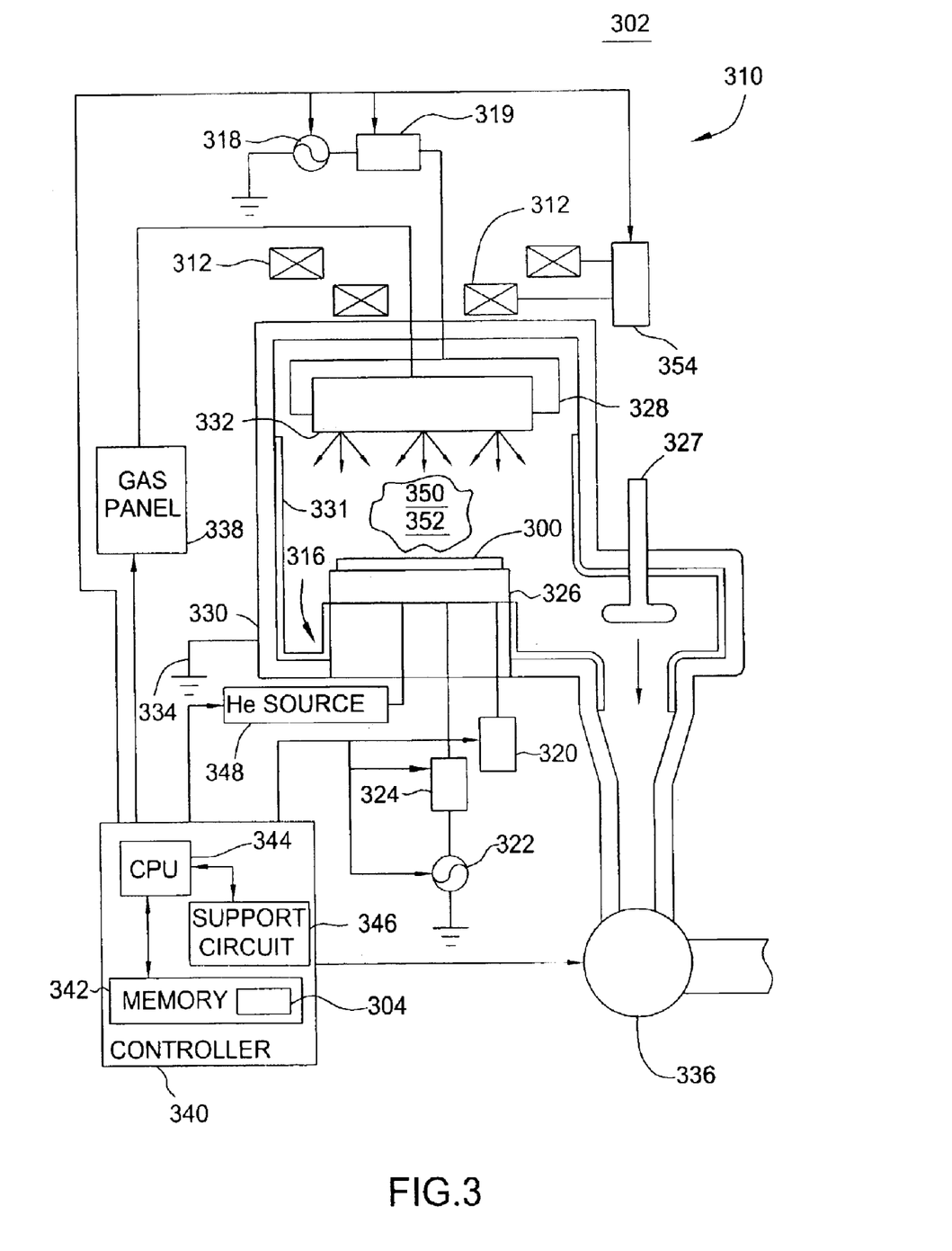
FIG. 3 is a schematic diagram of a plasma processing apparatus that may be used to practice embodiments of the invention.

In one embodiment of the invention, the affected region 220 is etched by placing the substrate 220 on the pedestal of an etch chamber such as the etch chamber depicted in FIG. 3. At least one etchant gas is provided to the chamber 310. The at least one etchant gas may comprise, for example, a halogenated species such as a fluorinated or chlorinated species. Suitable halogenated gases include, for example, compounds of carbon and fluorine, compounds of carbon, fluorine, and hydrogen, as well as other etchant gases known to the art of etching dielectric layers. Such gases include $CF_4$, $C_2F_6$, $C_4F_8$, $C_5F_8$, $C_4F_6$. The at least one etchant gas may comprise an oxygen-based material such as oxygen, nitrogen, or ozone. The etchant gas may also comprise an inert or carrier gas such as argon.

The etching of the affected region 220 may comprise supplying the halogenated gas (e.g., $CF_4$) to the chamber at a flow rate in a range from about 5 sccm to about 1000 sccm, supplying an oxygenated gas to the chamber at a flow rate in a range from about 0 sccm to about 1000 sccm, and supplying an inert gas to the chamber 310 at a flow rate in a range from about 0 sccm to about 1000 sccm. A power in a range of about 100 W to about 1000 W is applied to the source. A bias power in a range of about 100 W to 1000 W is applied to the pedestal. The pedestal may be maintained at a temperature in a range of about −20 to about 40 degrees Celsius. The affected region 220 may be etched for a period of time in a range that is commensurate with the extent of the altered dielectric constant. In one exemplary embodiment of the invention, carbon tetrafluoride ($CF_4$) is supplied to the chamber at a flow rate of 20 sccm, oxygen is supplied to the chamber at a flow rate of 10 sccm, and argon is supplied to the chamber at a flow rate of 100 sccm. The bias power is set to 300 watts and the source power is set to 400 watts. The chamber is maintained at a temperature of 10 degrees Celsius and a pressure of 30 mTorr. The dielectric layer is treated for 20 seconds.

Alternatively, the chemical etchant may be a liquid etching composition. The liquid etching composition may comprise, for example, an acid or other component capable of dissolving at least portions of the damaged region 220. The liquid may comprise, for example, hydrogen fluoride (HF). The liquid etching composition may be applied to the affected region 220 using, for example, a wet cleaning module. A suitable wet cleaning module is described in detail in U.S. patent application Ser. No. 09/945,454, filed Aug. 31, 2001 which is herein incorporated by reference.

In one exemplary embodiment of the invention, the liquid etching composition is applied to affected region 220 for a period of time that is commensurate with the extent of the altered dielectric constant. The liquid etching composition may comprise hydrogen fluoride in a concentration ranging of about 100:1 to about 10:1. The liquid etching composition may contact the affected region 220 for a period of time sufficient to partially or completely remove the affected region 220.

After treating the affected region 220 of the dielectric layer 202, the affected region 220 is partially removed, completely removed, and/or modified in a chemical, physical, or microstructural manner.

The processes discussed above for relieving the dielectric constant of a low K film may be practiced, for example, in a dual frequency capacitive plasma source reactor. The dual frequency capacitive plasma source reactor may be included in a processing system such as the CENTURA® semiconductor wafer processing system commercially available from Applied Materials, Inc. of Santa Clara, Calif. The reactor is discussed in detail with respect to FIG. 3 below. The reactor is adapted for processing the 300 mm wafers, operates in broad ranges of the process parameters and etchant chemistries, may use an endpoint detection system and has in-situ self-cleaning capabilities. In one embodiment of the invention, the reactor uses a 160 MHz plasma source to produce a high density plasma, a 13.56 MHz wafer bias source and a plasma magnetizing solenoid. The reactor provides independent control of ion energy, plasma density and uniformity, and wafer temperature. A detailed description of a suitable dual frequency capacitive plasma source reactor is provided in U.S. patent application Ser. No. 10/192,271, filed Jul. 9, 2002, which is herein incorporated by reference in its entirety.

FIG. 3 depicts a schematic, cross-sectional diagram of the dual frequency capacitive plasma source reactor 302 that may be used to practice the present invention. A reactor 302 comprises a process chamber 310 having a conductive chamber wall 330 that is connected to an electrical ground 334 and at least one solenoid segment 312 positioned exterior to the chamber wall 330. The chamber wall 330 comprises a ceramic liner 331 that facilitates cleaning of the chamber 310. The byproducts and residue of the etch process are readily removed from the liner 331 after each wafer is processed. The solenoid segment(s) 312 are controlled by a DC power source 354. The process chamber 310 also includes a wafer support pedestal 316 that is spaced apart from a showerhead 332. The wafer support pedestal 316 comprises an electrostatic chuck 326 for retaining a substrate 300 beneath the showerhead 332. The showerhead 332 may comprise a plurality of gas distribution zones such that various gases can be supplied to the chamber 310 using a specific gas distribution gradient. The showerhead 332 is mounted to an upper electrode 328 that opposes the support pedestal 316. The electrode 328 is coupled to a radio-frequency (RF) source 318.

The electrostatic chuck 326 is controlled by a DC power supply 320 and the support pedestal 316 through a matching network 324 that is coupled to a bias source 322. Optionally, the source 322 may be a DC or pulsed DC source. The upper electrode 328 is coupled to the RF source 318 through an impedance transformer 319 (e.g., a quarter wavelength matching stub). The bias source 322 is generally capable of producing an RF signal having a tunable frequency of 50 kHz to 13.56 MHz and a power of between 0 and 5000 Watts. The RF source 318 is generally capable of producing a RF signal having a tunable frequency of about 160 MHz and a power between about 0 and 1000 Watts. The interior of the chamber 310 is a high vacuum vessel that is coupled through a throttle valve 327 to a vacuum pump 336.

Those skilled in the art will understand that other forms of the plasma chambers and reactors may be used to practice the invention, including a reactive ion etch (RIE) chamber, an electron cyclotron resonance (ECR) chamber, a physical vapor deposition chamber, a rapid thermal processing chamber, a decoupled plasma source chamber, an inductively coupled plasma source chamber, and the like.

In operation, the substrate 300 is placed on the support pedestal 316 and thereafter the gaseous components are supplied to the process chamber 310 from a gas panel 338 through the showerhead 332 that forms a gaseous mixture 350. The gaseous mixture 350 is ignited into a plasma 352 in the process chamber 310 by applying the power from the RF source 318 to the upper electrode 328. A magnetic field is applied to the plasma via the solenoid segment(s) 312, and the support pedestal 316 is biased by applying the power from the bias source 322. During processing the substrate 300, the pressure within the interior of the etch chamber 310 is controlled using the gas panel 338 and the throttle valve 327.

The temperature of the chamber wall 330 is controlled using liquid-containing conduits (not shown) that are located in and around the wall. The temperature of the substrate 300 is controlled by stabilizing the temperature of the support pedestal 316 and flowing a helium (He) gas from a gas source 348 into the channels that are formed by the back side of the substrate 300 and the grooves (not shown) in the surface of the electrostatic chuck 326. The helium gas is used to facilitate a heat transfer between the pedestal 316 and the substrate 300. The electrostatic chuck 326 is heated by a resistive heater (not shown) within the chuck body to a steady state temperature and the helium gas facilitates uniform heating of the substrate 300. Using thermal control of the chuck 326, the substrate 300 is maintained at a temperature of between 10 and 500 degrees Celsius.

To facilitate control of the chamber 310 as described above, a controller 340, which may be one of any form of a general purpose computer processor, may be used in an industrial setting for controlling various chambers and subprocessors. The controller 340 comprises a central processing unit (CPU) 344, a memory 342, and support circuits 346 for the CPU 344 and is coupled to the various components of the etch process chamber 310 to facilitate control of the etch process. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. A software routine 304, when executed by the CPU 344, causes the reactor to perform processes of the present invention and is generally stored in the memory 342. The software routine 304 may also be stored and/or executed by a second CPU (not shown) that is remotely located from the hardware being controlled by the CPU 344.

The software routine 304 is executed after the substrate 300 is positioned on the pedestal 316. The software routine 304 when executed by the CPU 344, transforms the general purpose computer into a specific purpose computer (controller) 340 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

While foregoing is directed to embodiments of the present invention, other and further embodiments of the invention may be devised without departing from the basic scope thereof, and the scope thereof is determined by the claims that follow.

What is claimed is:

1. A method of treating a dielectric layer having a low dielectric constant, wherein the method comprises:
    providing a substrate comprising a dielectric layer having a first dielectiic constant, where the first dielectric constant is less than 4.0;
    processing the substrate in a manner that causes the dielectric constant in an affected region to change to a second dielectric constant, where the second dielectric constant is different from the first dielectric constant; and
    treating the affected region of the dielectric layer to modify a dielectric characteristic of the dielectric layer, wherein a treatment comprises at least one process selected from the group consisting of etching the affected region using a liquid etching composition including hydrogen fluoride or an etchant gas including at least one of $CF_4$, $C_4F_8$, $C_5F_8$, and $C_4F_6$, sputtering the affected region, and annealing the affected region.

2. The method of claim 1 wherein the annealing comprises heating the affected region to a temperature in a range from about 100 degrees Celsius to about 400 degrees Celsius.

3. The method of claim 1 wherein the treatment is annealing and annealing is performed for a period of time that is commensurate with an amount of change in dielectric constant in the affected region.

4. The method of claim 1 wherein the treatment is annealing and annealing is performed in an atmosphere consisting essentially of one or more inert gases.

5. The method of claim 4 wherein the one or more insert gases are selected from the group consisting of nitrogen, argon, helium, and combinations thereof.

6. The method of claim 1 wherein the sputtering comprises physically bombarding the affected region with at least one inert gas.

7. The method of claim 1 wherein the treatment is sputtering and sputtering comprises supplying argon and applying a bias power in a range from about 100 W to about 3000 W.

8. The method of claim 1 wherein the etching comprises exposing the affected region to at least one etchant gas and etching at least, portion of the affected layer.

9. The method of claim 8 wherein the at least one etchant gas comprises a halogenated gas.

10. The method of claim 9 wherein the halogenated gas is a fluorine-containing gas.

11. The method of claim 8 wherein the at least one etchant gas further comprises an oxygen-containing gas.

12. The method of claim 1 wherein the treatment is sputtering and etching comprises contacting the affected region with the liquid etching composition.

13. The method of claim 12 wherein the liquid etching composition comprises hydrogen fluoride.

14. The method of claim 1 wherein the change in dielectric constant of the affected region results from an exposure to a plasma.

15. The method of claim 14 wherein the plasma is an oxygen-containing plasma.

16. The method of claim 1 wherein the dielectric layer comprises silicon, oxygen and carbon.

17. The method of claim 16 wherein the dielectric layer comprises greater than or equal to 10% carbon.

18. The method of claim 1 wherein the treatment provides an effect selected from the group consisting of decreasing an oxygen concentration within the affected region, decreasing a hydrogen concentration within the affected region, and combinations thereof.

19. The method of claim 1 wherein the treatment comprises removing at least a portion of the affected region.

20. The method of claim 1 wherein the treatment comprises removing the entire affected region.

21. A method of treating a dielectric layer having a low dielectric constant, wherein the method comprises:
    providing a substrate comprising a dielectric layer having a first dielectric constant, where the first dielectric constant is less than 4.0;
    processing the substrate in a manner that causes the dielectric constant in an affected region to change to a second dielectric constant, where the second dielectric constant is different from the first dielectric constant; and
    etching the affected region of the dielectric layer to modify a dielectric characteristic of the dielectric layer using a liquid etching composition including hydrogen fluoride or an etchant gas including at least one of $CF_4$, $C_4F_8$, $C_5F_8$, and $C_4F_6$.

22. The method of claim 21 wherein the etching step comprises exposing the affected region to at least one etchant gas and etching at least a portion of the affected layer.

23. The method of claim 22 wherein the at least one etchant gas comprises a halogenated gas.

24. The method of claim 23 wherein the halogenated gas is a fluorine-containing gas.

25. The method of claim 22 wherein the at least one etchant gas further comprises an oxygen-containing gas.

26. The method of claim 21 wherein the etching step comprises contacting the affected region with the liquid etching composition.

27. The method of claim 26 wherein the liquid etching composition comprises hydrogen fluoride.

28. A method of treating a dielectric layer having a low dielectric constant, wherein the method comprises:

providing a substrate comprising a dielectric layer having a first dielectric constant, where the first dielectric constant is less than 4.0;

processing the substrate in a manner that causes the dielectric constant in an affected region to change to a second dielectric constant, where the second dielectric constant is different from the first dielectric constant; and sputtering the affected region of the dielectric layer to modify a dielectric characteristic of the dielectric layer.

29. The method of claim 28 wherein the sputtering step comprises physically bombarding the affected region with at least one inert gas.

30. The method of claim 28 wherein the sputtering step comprises supplying argon and applying a bias power in a range from about 100 W to about 3000 W.

31. A method of treating a dielectric layer having a low dielectric constant wherein the method comprises:

providing a substrate having a dielectric layer having a first dielectric constant where the first dielectric constant is less than 4.0;

processing the substrate in a manner that causes the dielectric constant in an affected region to change to a second dielectric constant, where the second dielectric constant is different from the first dielectric constant; and annealing the affected region of the dielectric layer to modify a dielectric characteristic of the dielectric layer.

32. The method of claim 31 wherein the annealing step comprises heating the affected region to a temperature in a range from about 100 degrees Celsius to about 400 degrees Celsius.

33. The method of claim 31 wherein the annealing step is performed for a period of time that is commensurate with an amount of change in dielectric constant in the affected region.

34. The method of claim 31 wherein the annealing step is performed in an atmosphere consisting essentially of one or more inert gases.

35. The method of claim 34 wherein the one or more insert gases are selected from the group consisting of nitrogen, argon, helium, and combinations thereof.

* * * * *

UNITED STATES PATENT AND TRADEMARK OFFICE
CERTIFICATE OF CORRECTION

PATENT NO. : 6,921,727 B2
DATED : July 26, 2005
INVENTOR(S) : Chiang et al.

It is certified that error appears in the above-identified patent and that said Letters Patent is hereby corrected as shown below:

<u>Column 6,</u>
Line 13, delete "mtorr." and insert -- mTorr. --.

<u>Column 9,</u>
Line 39, delete "dielectilc" and insert -- dielectric --.
Line 65, delete "insert" and insert -- inert --.

<u>Column 10,</u>
Line 10, after "at least" delete "," and insert -- a --.

<u>Column 11,</u>
Lines 22 and 24, after "constant" insert -- , --.

<u>Column 12,</u>
Line 22, delete "insert" and insert -- inert --.

Signed and Sealed this

Fourteenth Day of February, 2006

JON W. DUDAS
*Director of the United States Patent and Trademark Office*